US008890002B2

(12) United States Patent
Arai et al.

(10) Patent No.: US 8,890,002 B2
(45) Date of Patent: Nov. 18, 2014

(54) RESIN MULTILAYER SUBSTRATE AND METHOD FOR MANUFACTURING THE RESIN MULTILAYER SUBSTRATE

(75) Inventors: Masashi Arai, Nagaokakyo (JP); Mayuko Nishihara, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 10 days.

(21) Appl. No.: 13/403,042

(22) Filed: Feb. 23, 2012

(65) Prior Publication Data

US 2012/0145445 A1 Jun. 14, 2012

Related U.S. Application Data

(63) Continuation of application No. PCT/JP2010/064253, filed on Aug. 24, 2010.

(30) Foreign Application Priority Data

Aug. 24, 2009 (JP) .................................. 2009-192688
Oct. 30, 2009 (JP) .................................. 2009-249622

(51) Int. Cl.
| | | |
|---|---|---|
| H05K 1/00 | (2006.01) | |
| H01L 23/538 | (2006.01) | |
| H01L 23/498 | (2006.01) | |
| H01L 23/50 | (2006.01) | |
| H01L 25/16 | (2006.01) | |
| H01L 25/00 | (2006.01) | |
| H05K 1/18 | (2006.01) | |
| H01L 25/065 | (2006.01) | |
| H05K 3/40 | (2006.01) | |
| H05K 3/46 | (2006.01) | |

(52) U.S. Cl.
CPC ...... *H01L 23/5389* (2013.01); *H01L 23/49827* (2013.01); *H01L 23/50* (2013.01); *H01L 25/16* (2013.01); *H01L 25/50* (2013.01); *H05K 1/186* (2013.01); *H01L 25/0652* (2013.01); *H01L 2924/09701* (2013.01); *H05K 3/4069* (2013.01); *H05K 3/4652* (2013.01); *H05K 3/4673* (2013.01); *H05K 2201/0195* (2013.01); *H05K 2201/09481* (2013.01); *H05K 2201/09827* (2013.01); *H05K 2201/09845* (2013.01); *H05K 2201/10636* (2013.01); *H05K 2203/0191* (2013.01); *H01L 2224/16225* (2013.01)
USPC ......................................................... 174/265

(58) Field of Classification Search
CPC ............. H05K 3/429; H05K 2201/096; H01L 2924/01078
USPC ................. 174/260, 261, 262, 264, 265, 266; 361/760, 761
See application file for complete search history.

(56) References Cited

U.S. PATENT DOCUMENTS

| 7,297,878 B2 * | 11/2007 | Kushitani et al. ............. 174/264 |
| 7,707,715 B2 * | 5/2010 | Okabe et al. .................... 29/846 |

(Continued)

FOREIGN PATENT DOCUMENTS

| CN | 101352109 A | 1/2009 |
| JP | 2001-244636 A | 9/2001 |
| JP | 2003-069228 A | 3/2003 |
| JP | 2003-124380 A | 4/2003 |
| WO | 2009/081853 A1 | 7/2009 |

OTHER PUBLICATIONS

Official Communication issued in International Patent Application No. PCT/JP2010/064253, mailed on Nov. 2, 2010.

*Primary Examiner* — Boris Chervinsky
*Assistant Examiner* — Pete Lee
(74) *Attorney, Agent, or Firm* — Keating & Bennett, LLP

(57) ABSTRACT

A resin multilayer substrate includes a component-containing layer and a thin resin layer stacked on a surface of the component-containing layer. The resin multilayer substrate further includes a surface electrode located on a surface opposite to the surface of the thin resin layer stacked on the component-containing layer, a first via conductor provided in the component-containing layer, which includes an end reaching one surface of the component-containing layer, and a second via conductor provided in the thin resin layer, which includes a first end electrically connected to the surface electrode and a second end electrically connected to the via conductor. A portion of the thin resin layer in contact with the second via conductor defines a projection projecting into the first via conductor.

6 Claims, 16 Drawing Sheets

(56) References Cited

U.S. PATENT DOCUMENTS

| | | | |
|---|---|---|---|
| 7,786,390 B2* | 8/2010 | Ikeda | 174/255 |
| 8,431,832 B2* | 4/2013 | Nagasawa et al. | 174/262 |
| 2003/0085058 A1* | 5/2003 | Komatsu et al. | 174/264 |
| 2005/0136646 A1* | 6/2005 | Larnerd et al. | 438/629 |
| 2010/0236698 A1 | 9/2010 | Sekimoto | |
| 2010/0307809 A1* | 12/2010 | Noda et al. | 174/266 |
| 2012/0175155 A1 | 7/2012 | Ikeda | |

* cited by examiner

RESIN MULTILAYER SUBSTRATE AND METHOD FOR MANUFACTURING THE RESIN MULTILAYER SUBSTRATE

BACKGROUND OF THE INVENTION

1. Field of the Invention

The present invention relates to a resin multilayer substrate including at least two resin layers and via conductors, and a method for manufacturing the resin multilayer substrate.

2. Description of the Related Art

In recent years, with more electronic components being densely packed into packages, resin multilayer substrates have been used for mounting electronic components, in which via conductors in communication with each other are provided for respective multiple stacked resin layers provided with a plurality of via holes, with an increased density of conductive paste in a plurality of via holes. For example, Japanese Patent Application Laid-Open No. 2003-124380 discloses a resin multilayer substrate which has respective resin layers provided with via conductors in communication with each other, and a method for manufacturing the resin multilayer substrate.

In the case of an electronic component-containing module and a manufacturing method therefor as disclosed in Japanese Patent Application Laid-Open No. 2003-124380, a carrier with an IC mounted thereon is coated with an insulating layer composed of a thermosetting resin to provide a cured wiring substrate, and inner via holes are formed in the wiring substrate to form through via holes. Blind via holes and the through via holes are each filled with a conductive paste, and a thin resin layer is laminated onto the wiring substrate so as to provide the blind via holes and through via holes in communication with each other. Copper foil is laminated onto the thin resin layer, the thin resin layer and the conductive paste are brought into a cured state, and the copper foil is subjected to patterning to form surface electrodes.

However, in the case of the method for manufacturing a resin multilayer substrate as disclosed in Japanese Patent Application Laid-Open No. 2003-124380, it is not possible to fill more than the internal volume of the blind via holes and through via holes with the conductive paste. Thus, the method has a problem that it is not possible to increase the density of the conductive paste in the blind via holes and through via holes, or reduce the resistance value of blind via conductors and through via conductors obtained by curing the conductive paste in the blind via holes and through via holes.

In addition, the blind via holes and the through via holes are each filled with the conductive paste, and then, the thin resin layer is laminated onto the wiring substrate. Thus, the method has a problem that the conductive paste is exuded from the blind via holes or the through via holes to spread to the interface between the wiring substrate and the thin resin layer, thereby decreasing the insulation performance between the wiring substrate and the thin resin layer.

Furthermore, because the thin resin layer is small in thickness, the area of contact is small between the through via holes and the conductive paste filling the through via holes, and the method thus has a problem that there is a possibility that the force generated when the conductive paste is brought into a cured state peels off, from the thin resin layer, the surface electrodes formed on the through via holes, along with the conductive paste filling the through via holes.

SUMMARY OF THE INVENTION

In view of the circumstances described above, preferred embodiments of the present invention provide a resin multilayer substrate wherein a surface electrode is much less likely to be peeled off from a resin layer, and a method for manufacturing the resin multilayer substrate. In addition, preferred embodiments of the present invention provide a resin multilayer substrate which increases the density of a conductive paste in a via hole to reduce the resistance value of a via conductor and prevents the ingress of the conductive paste into the interface between stacked resin layers, and a method for manufacturing the resin multilayer substrate.

A resin multilayer substrate according to a first preferred embodiment of the present invention includes a first resin layer and a second resin layer stacked on a surface of the first resin layer, wherein the resin multilayer substrate includes a surface electrode located on a surface opposite to the surface of the second resin layer stacked on the first resin layer, a first via conductor provided in the first resin layer, the first via conductor including an end reaching the surface of the first resin layer, and a second via conductor provided in the second resin layer, the second via conductor including a first end electrically connected to the surface electrode and a second end electrically connected to the first via conductor, and at least a portion of the second resin layer in contact with the second via conductor defines a projection projecting into the first via conductor.

According to the first preferred embodiment of the present invention, the area of contact is increased between the second resin layer and the conductive paste. Therefore, the joining force between the second resin layer and the second via conductor is increased so as to decrease the possibility of peeling off of the surface electrode along with the conductive paste from the second resin layer. In addition, the direction in which at least the portion of the second resin layer in contact with the second via conductor is projected into the first via conductor is opposite to the direction in which the second resin layer is peeled from the first resin layer, and the joining force is thus increased between the first resin layer and the second resin layer.

In addition, a resin multilayer substrate according to a second preferred embodiment of the present invention preferably has the same structure as the resin multilayer substrate according to the first preferred embodiment of the present invention, and includes a base layer with a wiring pattern located on at least one surface of the base layer, wherein the first resin layer and the second resin layer are sequentially stacked on a surface of the base layer with the wiring pattern formed thereon, and the wiring pattern is electrically connected to the first via conductor, which allows additional electronic components to be even more densely mounted.

In addition, a resin multilayer substrate according to a third preferred embodiment of the present invention preferably has the same structure as the resin multilayer substrate according to the first preferred embodiment of the present invention, and includes a wiring pattern located on a surface of the first resin layer opposite to the surface with the second resin layer stacked thereon; and an electronic component contained in the first resin layer and mounted on the wiring pattern, which allows additional electronic components to be even more densely mounted.

In addition, a resin multilayer substrate according to a fourth preferred embodiment of the present invention preferably has the same structure as the resin multilayer substrate according to the first preferred embodiment of the present invention, wherein an electronic component is mounted on at least one surface of the base layer, and the mounted electronic component is contained in the first resin layer. Thus, electronic components can be mounted on the both surfaces of the base layer, thereby allowing more electronic components to be further densely mounted.

In addition, a resin multilayer substrate according to a fifth preferred embodiment of the present invention preferably has the same structure as the resin multilayer substrate according to any of the first through fourth preferred embodiments of the present invention, wherein the surface electrode is electrically connected to an electrode located on a mother board, thus improving the reliability of the connection between the resin multilayer substrate and the mother board.

In addition, a resin multilayer substrate according to a sixth preferred embodiment of the present invention preferably has the same structure as the resin multilayer substrate according to any of the first through fifth preferred embodiments of the present invention, wherein the first via conductor is arranged such that a taper angle in an area of the second resin layer is larger than a taper angle in another section.

According to the sixth preferred embodiment of the present invention, the first via conductor is arranged so that a taper angle in the vicinity of the second resin layer is larger than the taper angle in the other section, and at least a portion of the uncured second resin layer in contact with the second via conductor can thus bend into the first via conductor under its own weight to provide projections projecting into the first via conductor.

A method for manufacturing a resin multilayer substrate according to a seventh preferred embodiment of the present invention is a method for manufacturing a resin multilayer substrate including a first resin layer and a second resin layer stacked on a surface of the first resin layer, the method including a first step of forming a first via hole in a cured first resin layer; a second step of forming a second via hole in an uncured second resin layer, and stacking the second resin layer on a surface of the first resin layer such that the first via hole and the second via hole are in communication with each other; a third step of filling the first via hole and the second via hole with a conductive paste to form a first via conductor and a second via conductor; a fourth step of projecting at least a portion of the second resin layer in contact with the second via conductor into the first via conductor; and a fifth step of curing the conductive paste and the second resin layer.

According to the seventh preferred embodiment of the present invention, the first via hole is formed in the cured first resin layer, the second via hole is formed in the uncured second resin layer, and after stacking the second resin layer on the surface of the first resin layer such that the first via hole and the second via hole are in communication with each other, the first via hole and the second via hole are filled with the conductive paste. Thus, the ingress of the conductive paste will not be caused at the interface between the first resin layer and second resin layer, and the insulation performance will not be decreased between the first resin layer and the second resin layer. In addition, at least a portion of the second resin layer in contact with the second via conductor is projected into the first via conductor filling with the conductive paste, and the conductive paste and the second resin layer are cured to form a projection projecting into the first via conductor, which is at least the portion of the second resin layer in contact with the second via conductor. Thus, at least the portion of the second resin layer in contact with the second via conductor can push the conductive paste into the first via hole and the second via hole to increase the density of the conductive paste in the first via hole and in the second via hole, and reduce the resistance value of the first via conductor and second via conductor.

In addition, a method for manufacturing a resin multilayer substrate according to an eighth preferred of the present invention preferably includes the steps of the method according to the seventh preferred embodiment of the present invention, wherein the conductive paste is protruded from the second via hole so as to have at least an upwardly convex shape when the first via hole and the second via hole are filled with the conductive paste in the third step, and wherein the conductive paste protruded from the second via hole is pushed into the second via hole with an object having a cross section larger than a cross section of the second via hole on the protruded side of the conductive paste to project at least a portion of the second resin layer in contact with the second via conductor into the first via conductor in the fourth step. Therefore, the conductive paste protruded from the second via hole can be pushed into the first via hole and the second via hole to increase the density of the conductive paste in the first via hole and in the second via hole, and reduce the resistance value of the first via conductor and second via conductor.

In addition, a method for manufacturing a resin multilayer substrate according to a ninth preferred embodiment of the present invention preferably includes the steps of the method according to the eighth preferred embodiment of the present invention, wherein a retention film to retain the shape of the second resin layer is attached to a surface of the uncured second resin layer, a third via hole in communication with the second via hole formed in the second resin layer is formed in the attached retention film, the first via hole, the second via hole, and the third via hole are filled with the conductive paste in the third step, and after completing the third step, the retention film is peeled off from the second resin layer to adapt the conductive paste filling the third via hole formed in the retention film to the conductive paste protruded from the second via hole. Therefore, the amount of the conductive paste protruded from the second via hole can be controlled by changing the thickness of the retention film.

In addition, a method for manufacturing a resin multilayer substrate according to a tenth preferred embodiment of the present invention preferably includes the steps of the method according to the seventh preferred embodiment of the present invention, wherein the second resin layer is pressurized in a direction toward the first resin layer to project at least a portion of the second resin layer in contact with the second via conductor into the first via conductor in the fourth step, which increases the density of the conductive paste in the first via hole and in the second via hole, and reduces the resistance value of the first via conductor and second via conductor.

In addition, a method for manufacturing a resin multilayer substrate according to an eleventh preferred embodiment of the present invention preferably includes the steps of the method according to the seventh preferred embodiment of the present invention, wherein the first via hole is formed so that a taper angle in the vicinity of the second resin layer is larger than a taper angle in another section in the first step such that at least a portion of the uncured second resin layer in contact with the second via conductor can thus bend into the first via conductor under its own weight to form projections projecting into the first via conductor.

In addition, a method for manufacturing a resin multilayer substrate according to a twelfth preferred embodiment of the present invention preferably includes the steps of the method according to the seventh preferred embodiment of the present invention, wherein after the second resin layer is stacked on the surface of the first resin layer, processing is carried out for providing the first via hole and the second via hole in communication with each other in the second step. Thus, the first via hole can be kept in communication with the second via hole.

The resin multilayer substrate according to a preferred embodiment of the present invention includes the surface electrode located on the surface opposite to the surface of the second resin layer stacked on the first resin layer, the first via conductor provided in the first resin layer and including an end reaching the surface of the first resin layer, and a second via conductor provided in the second resin layer including a first end electrically connected to the surface electrode and a second end electrically connected to the first via conductor, and wherein at least a portion of the second resin layer in contact with the second via conductor forms a projection projecting into the first via conductor. Thus, the area of contact is increased between the second resin layer and the conductive paste. Therefore, the joining force between the second resin layer and the second via conductor can be increased to decrease the possibility of peeling off of the surface electrode along with the conductive paste from the second resin layer.

In a method for manufacturing the resin multilayer substrate according to a preferred embodiment of the present invention, the first via hole is formed in the cured first resin layer, the second via hole is formed in the uncured second resin layer, and after stacking the second resin layer on a surface of the first resin layer so as to have the first via hole and the second via hole in communication with each other, the first via hole and the second via hole are filled with the conductive paste. Thus, the ingress of the conductive paste will not be caused at the interface between the first resin layer and second resin layer, and the insulation performance will not be decreased between the first resin layer and the second resin layer. In addition, at least a portion of the second resin layer in contact with the second via conductor is projected into the first conductor filling with the conductive paste, and the conductive paste and the second resin layer are cured to form a projection projecting into the first via conductor, which is at least the portion of the second resin layer in contact with the second via conductor. Thus, at least the portion of the second resin layer in contact with the second via conductor can push the conductive paste into the first via hole and the second via hole to increase the density of the conductive paste in the first via hole and in the second via hole, and reduce the resistance value of the first via conductor and second via conductor.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Resin multilayer substrates and methods for manufacturing the resin multilayer substrates according to preferred embodiments of the present invention will be specifically described below with reference to the drawings. The following preferred embodiments are not intended to limit the present invention, and it is noted that all of the combinations of characteristic matters described in the preferred embodiments are not necessarily essential.

Preferred Embodiment 1

Figure 1:
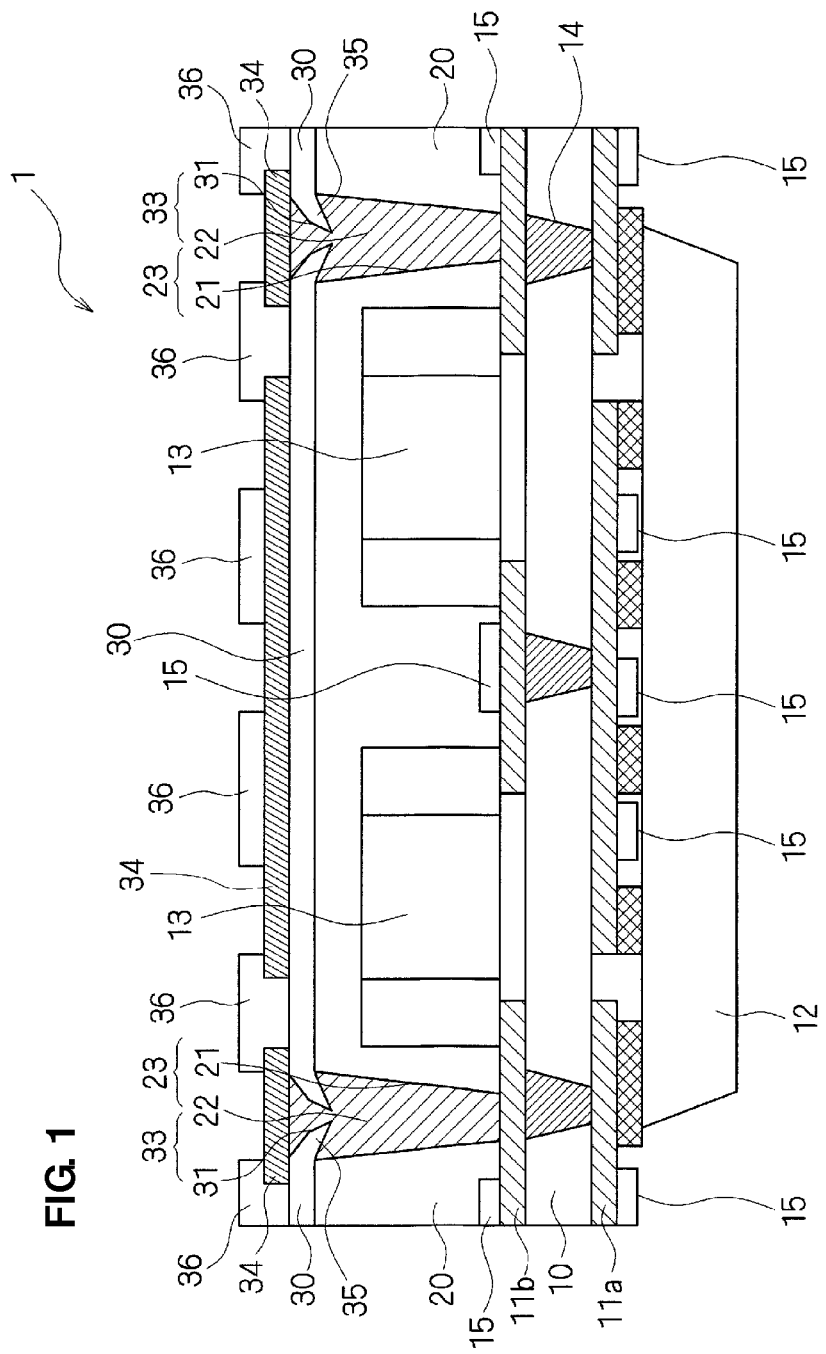
FIG. 1 is a schematic diagram illustrating the structure of a resin multilayer substrate according to preferred embodiment 1 of the present invention.

FIG. 1 is a schematic diagram illustrating the structure of a resin multilayer substrate according to preferred embodiment 1 of the present invention. As shown in FIG. 1, the resin multilayer substrate 1 according to preferred embodiment 1 includes a base layer 10, a component-containing layer (a first resin layer) 20, and a thin resin layer (a second resin layer) 30 which are stacked sequentially. The base layer 10 preferably is made of a ceramic, glass, an epoxy resin, or other suitable material, which has wiring patterns 11a, 11b located on both sides. The surface of the base layer 10 including the wiring pattern 11a and the surface thereof including the wiring pattern 11b respectively have an IC element 12 and a plurality of electronic components 13 mounted thereon preferably through a conductive joining material (not shown) such as solder. The plurality of electronic components 13 preferably are surface-mounted components, which are, for example, chip capacitors, resistors, etc., for example. The wiring pattern 11a is electrically connected to the wiring pattern 11b through a plurality of via conductors 14 located in the base layer 10. In addition, resist layers 15 are provided in predetermined positions of the wiring patterns 11a, 11b, to reliably provide insulation properties.

The component-containing layer 20 is stacked on the surface of the base layer 10 including the wiring pattern 11b, and contains therein the plurality of electronic components 13 mounted and a portion of the wiring pattern 11b. The component-containing layer 20 is preferably made of a thermosetting resin such as an epoxy resin, and has a thickness such that at least the plurality of electronic components 13 are not exposed to the outside. In addition, the component-containing layer 20 includes a plurality of via holes (first via holes) 21 filled with a conductive paste 22 to define a plurality of via conductors (first via conductors) 23. The plurality of via conductors 23 each include a first reaching one surface of the component-containing layer 20 with the thin resin layer 30 stacked, and a second end electrically connected to the wiring pattern 11b.

The thin resin layer 30 is sufficiently thin as compared with the component-containing layer 20, and stacked on the surface of the component-containing layer 20 so that the component-containing layer 20 is sandwiched between the thin resin layer 30 and the base layer 10. The thin resin layer 30 is preferably made of a thermosetting resin such as an epoxy resin. The thin resin layer 30 includes a plurality of via holes (second via holes) 31 filled with the conductive paste 22 to define a plurality of via conductors (second via conductors) 33. The plurality of via conductors 33 each include first ends electrically connected to surface electrodes 34 disposed on the surface opposite to the surface of the thin resin layer 30 stacked on the component-containing layer 20, and include second ends electrically connected to the plurality of via conductors 23. In addition, portions of the thin resin layer 30 in contact with the plurality of via conductors 33 define projections 35 projecting into the plurality of via conductors 23 included in the component-containing layer 20. Therefore, the area of contact is increased between the portions of the thin resin layer in contact with the plurality of via conductors 33 and the conductive paste 22. Therefore, the joining force between the thin resin layer 30 and the plurality of via conductors 33 can be increased to decrease the possibility of peeling off of the surface electrodes 34 along with the conductive paste 22 from the thin resin layer 30. Further, resist layers 36 are also provided at predetermined positions of the surface electrode 34 to reliably provide insulation properties.

Figure 2:
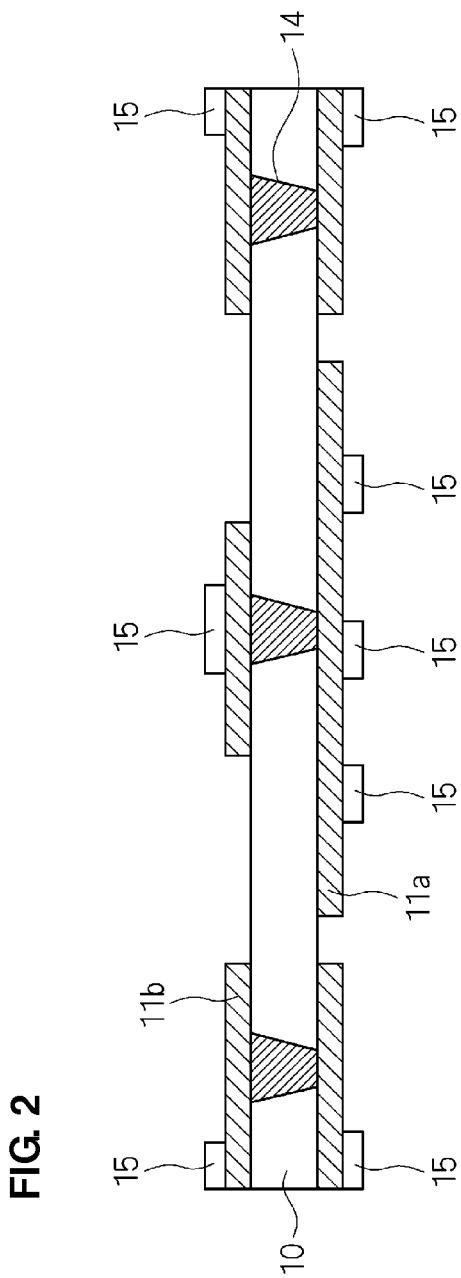
FIG. 2 is a schematic diagram for explaining a method for manufacturing the resin multilayer substrate according to preferred embodiment 1 of the present invention.
Figure 3:
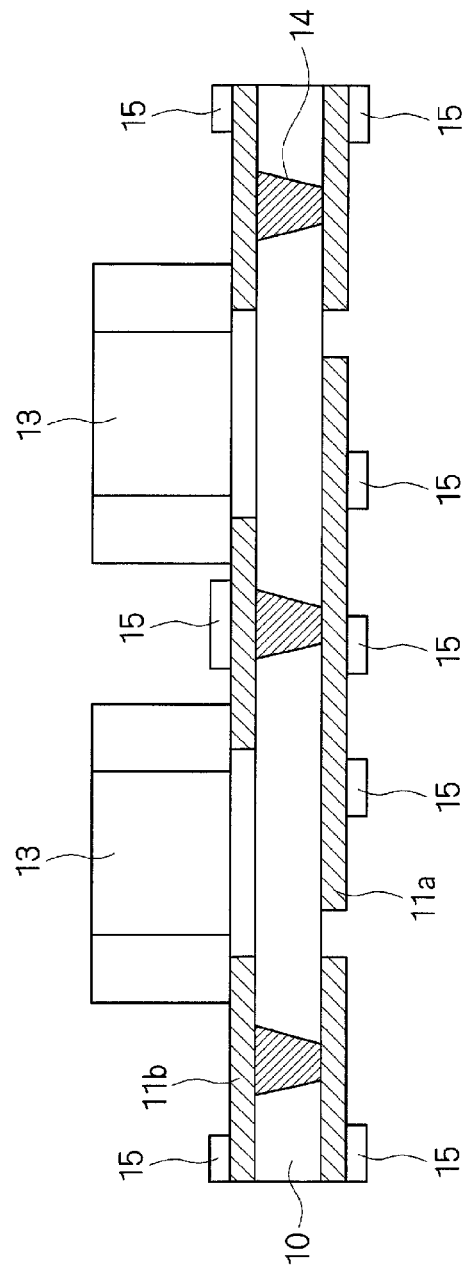
FIG. 3 is a schematic diagram for explaining the method for manufacturing the resin multilayer substrate according to preferred embodiment 1 of the present invention.
Figure 4:
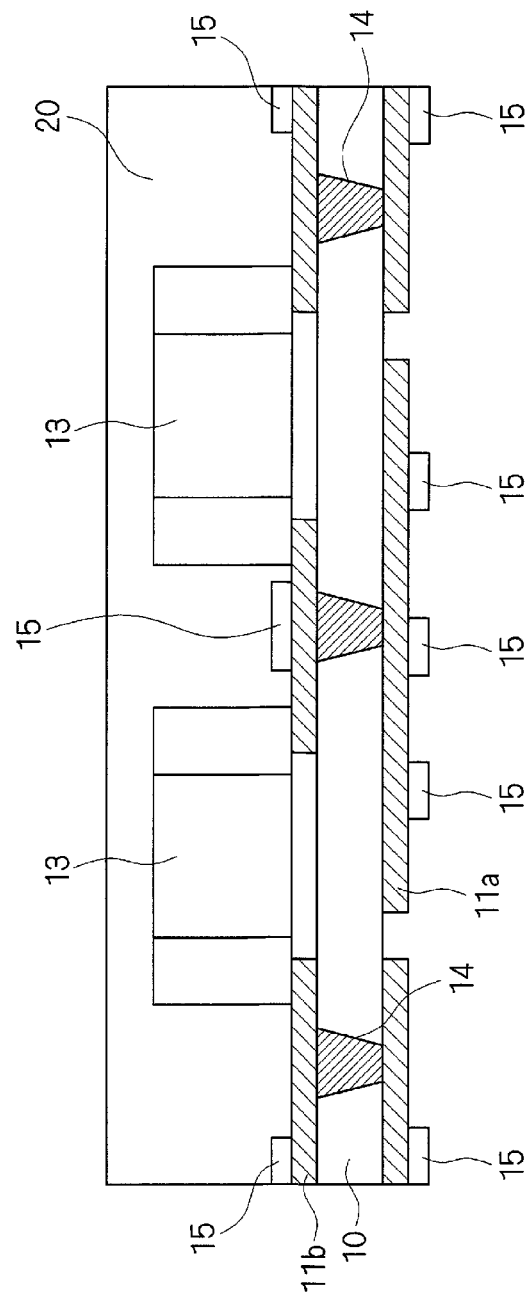
FIG. 4 is a schematic diagram for explaining the method for manufacturing the resin multilayer substrate according to preferred embodiment 1 of the present invention.
Figure 5:
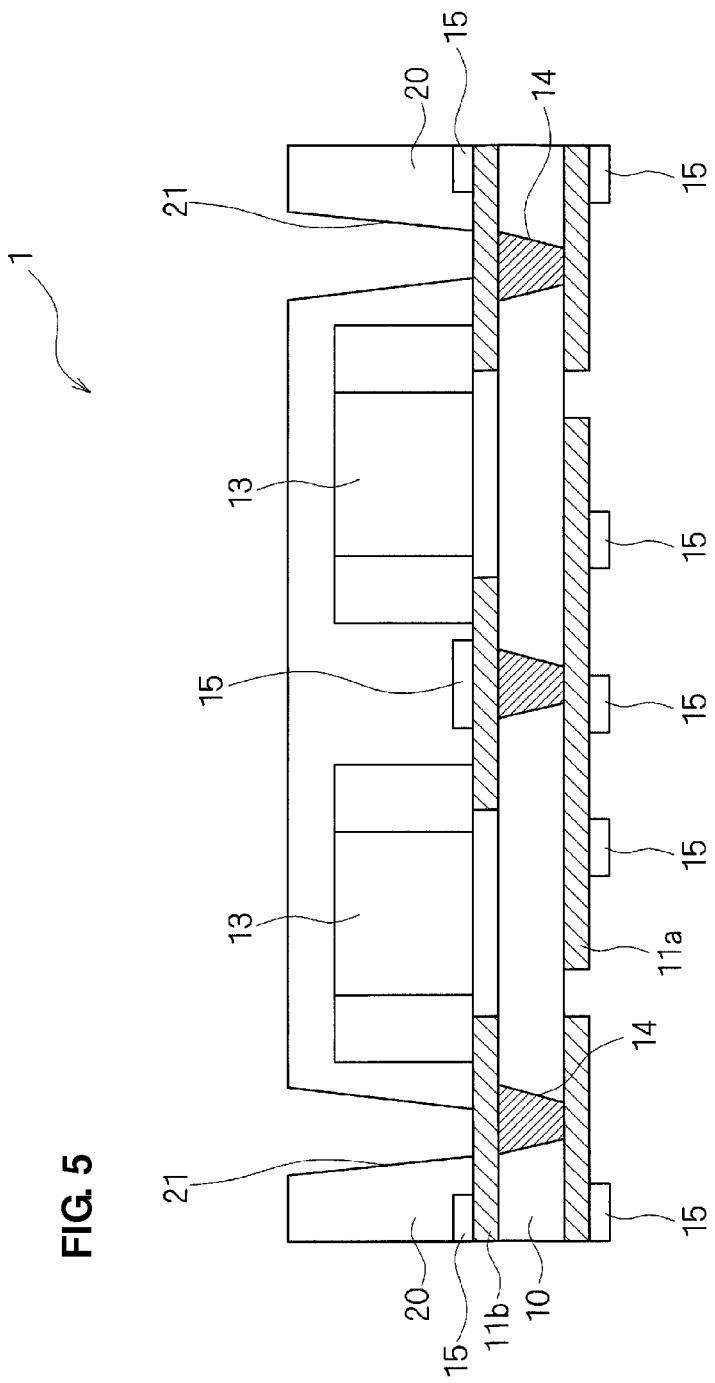
FIG. 5 is a schematic diagram for explaining the method for manufacturing the resin multilayer substrate according to preferred embodiment 1 of the present invention.
Figure 6:
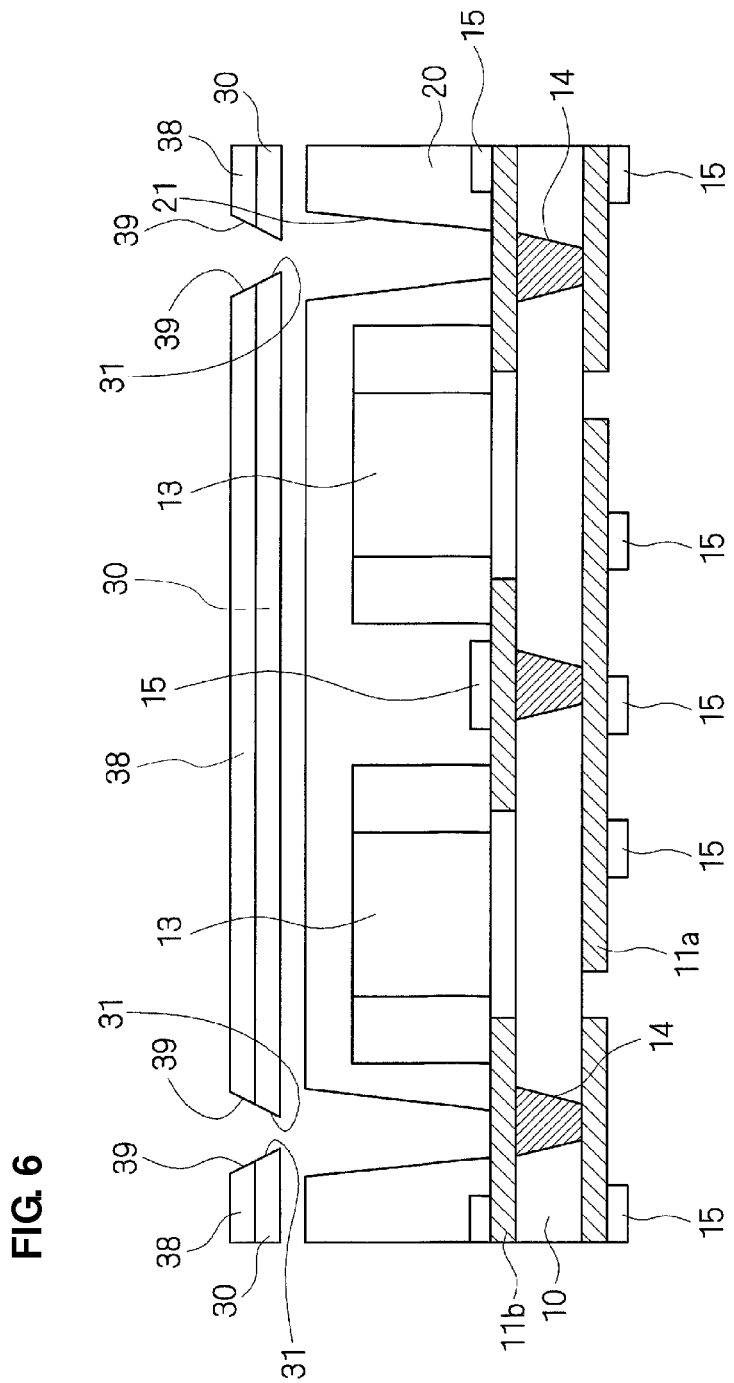
FIG. 6 is a schematic diagram for explaining the method for manufacturing the resin multilayer substrate according to preferred embodiment 1 of the present invention.
Figure 7A:
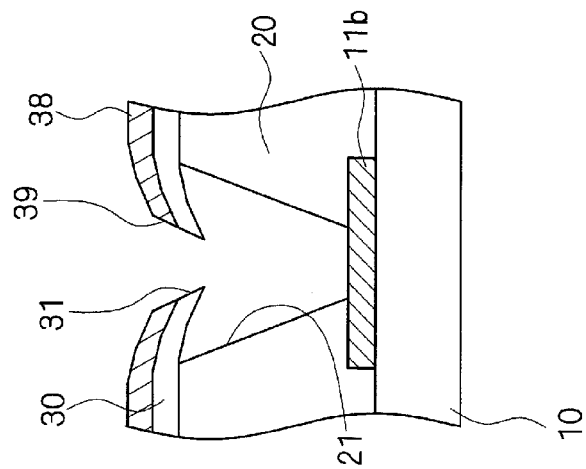
FIGS. 7A-7C are schematic diagrams for explaining the method for manufacturing the resin multilayer substrate according to preferred embodiment 1 of the present invention.
Figure 7B:
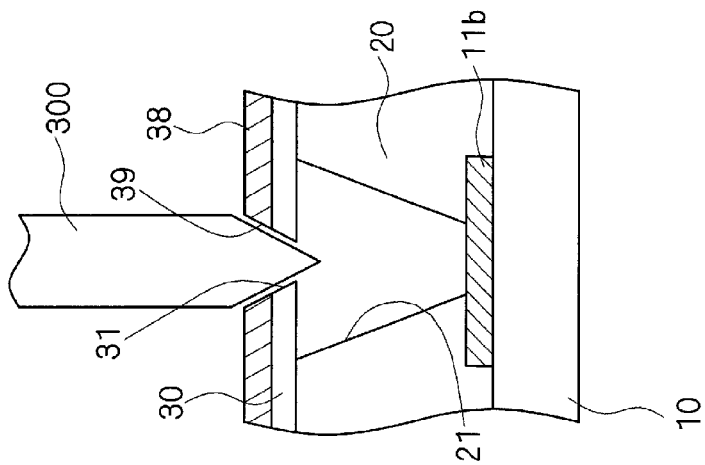
Figure 7C:
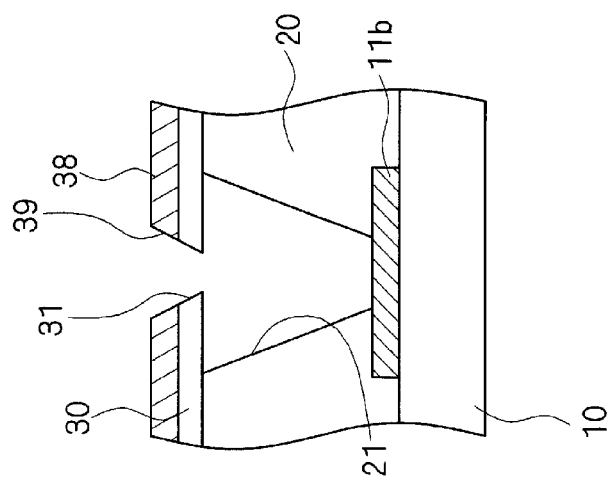
Figure 8:
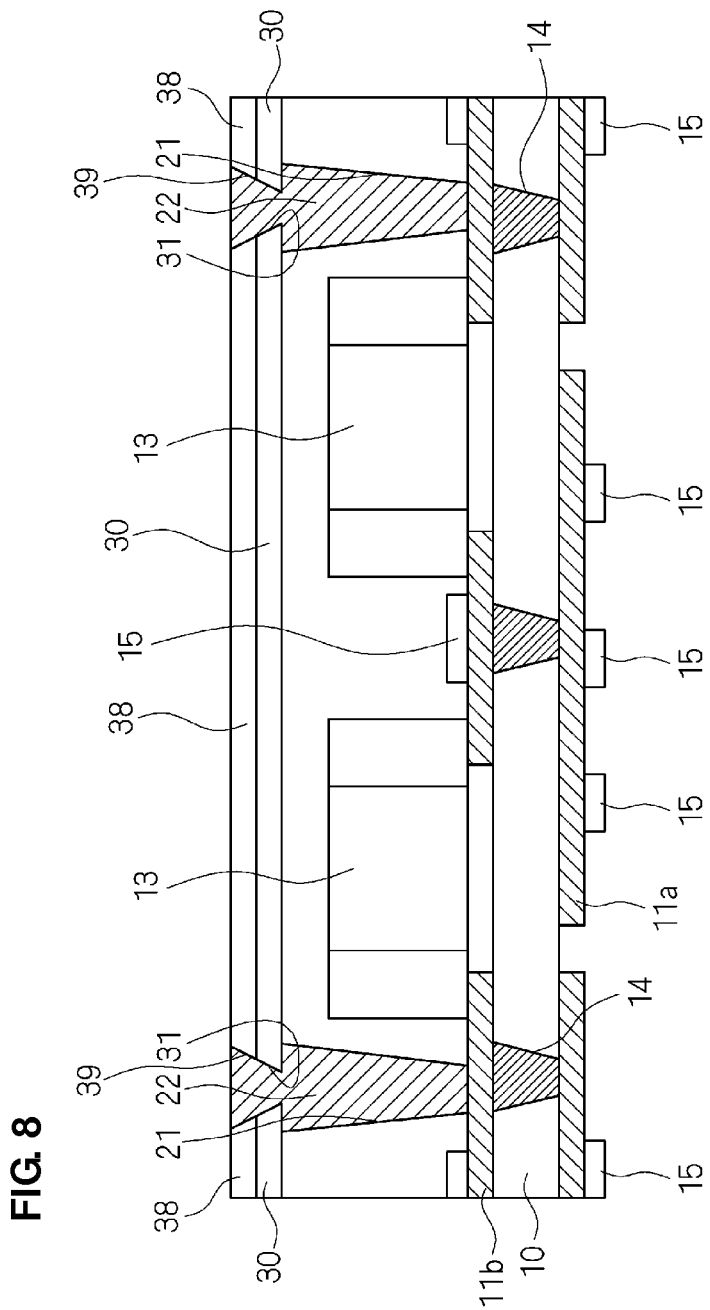
FIG. 8 is a schematic diagram for explaining the method for manufacturing the resin multilayer substrate according to preferred embodiment 1 of the present invention.
Figure 9:
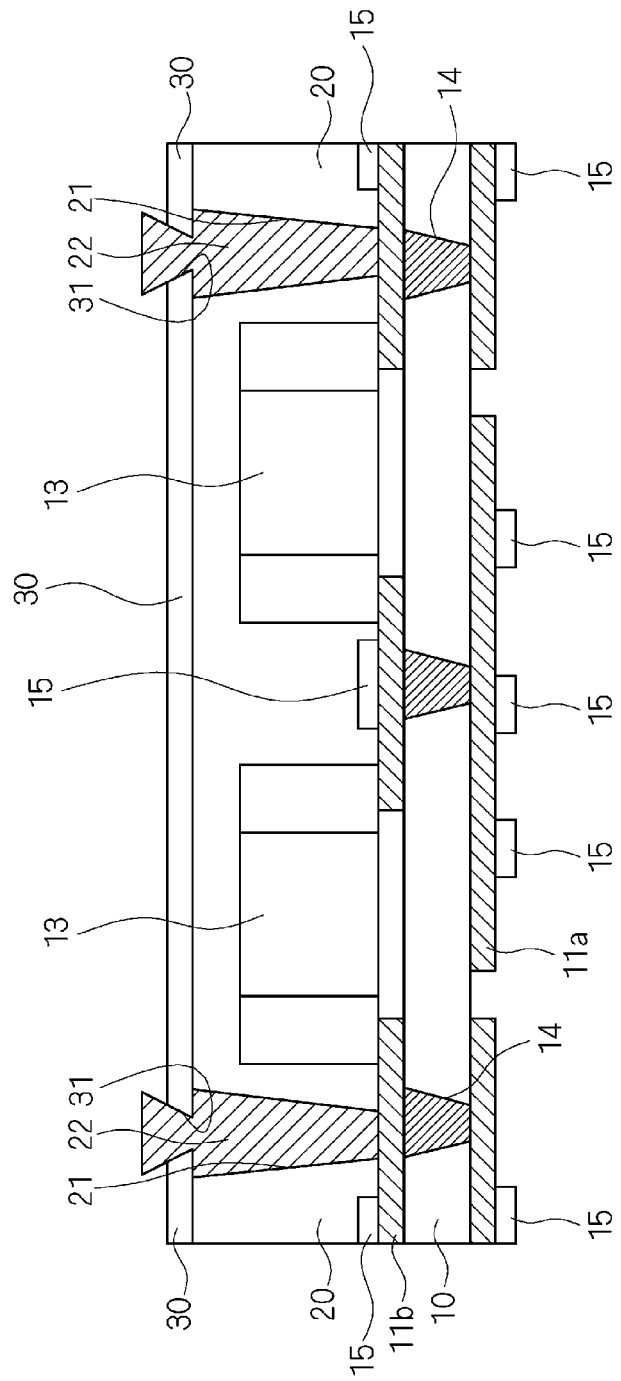
FIG. 9 is a schematic diagram for explaining the method for manufacturing the resin multilayer substrate according to preferred embodiment 1 of the present invention.
Figure 10:
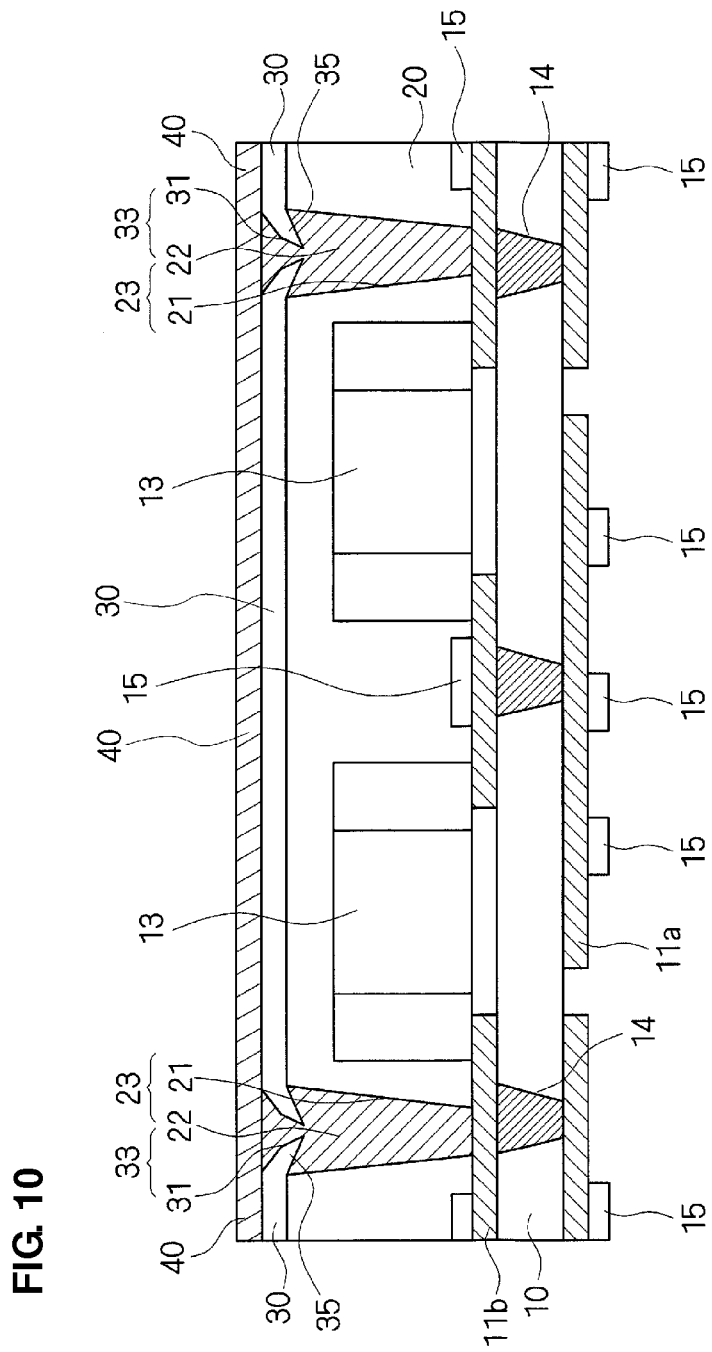
FIG. 10 is a schematic diagram for explaining the method for manufacturing the resin multilayer substrate according to preferred embodiment 1 of the present invention.
Figure 11:
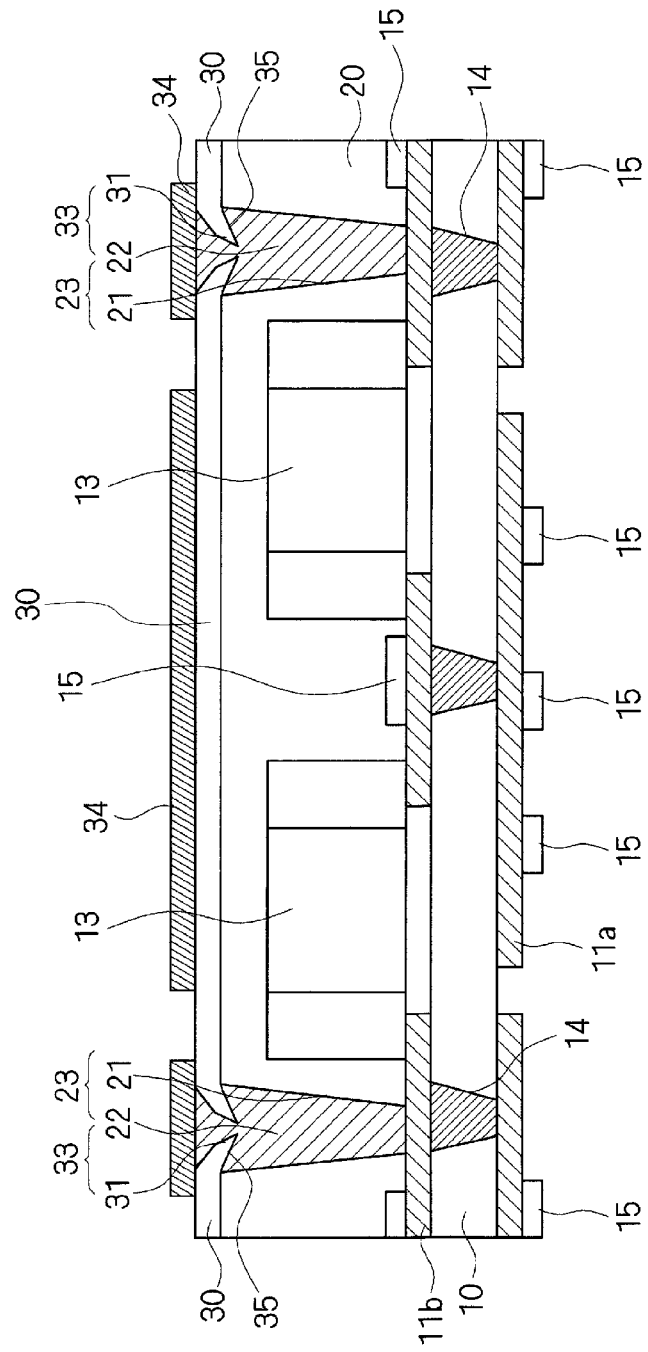
FIG. 11 is a schematic diagram for explaining the method for manufacturing the resin multilayer substrate according to preferred embodiment 1 of the present invention.

FIGS. 2 to 11 are schematic diagrams for explaining a method for manufacturing the resin multilayer substrate 1 according to preferred embodiment 1 of the present invention. FIG. 2 shows the base layer 10 prepared, FIG. 3 shows the plurality of electronic components 13 mounted on the base layer 10, FIG. 4 shows the component-containing layer 20 stacked on the base layer 10, FIG. 5 shows the plurality of via holes 21 formed in the component-containing layer 20, and FIG. 6 shows the thin resin layer 30 with the plurality of via holes 31 formed therein, which is stacked on the component-containing layer 20. FIGS. 7A-7C show processing to provide via holes in communication with each other, which is applied to the plurality of via holes 21, 31. In addition, FIG. 8 shows the plurality of via holes 21, 31 filled with the conductive paste 22, FIG. 9 shows the conductive paste 22 protruded in a convex shape upwardly from the plurality of via holes 31, FIG. 10 shows metal foil attached to the thin resin layer 30, and FIG. 11 shows the surface electrodes 34 formed by patterning of the metal foil.

As shown in FIG. 2, the wiring patterns 11a, 11b are formed on the both sides of the base layer 10, and the base layer has the plurality of via conductors 14 formed therein to electrically connect the wiring pattern 11a to the wiring pattern 11b. The wiring patterns 11a, 11b can be formed by patterning of metal layers (for example, Cu layers) formed over the respective surfaces of the base layer 10 into predetermined patterns with the use of photolithography. It is to be noted that the resist layers 15 formed on the wiring patterns 11a, 11b can be also formed with the use of photolithography in the same way as the wiring patterns 11a, 11b. The base layer 10 may be a resin substrate typified by FR4, or may be a ceramic substrate such as alumina and LTCC (Low Temperature Co-fired Ceramics), for example.

Next, as shown in FIG. 3, the plurality of electronic components 13 are mounted on the surface of the base layer 10 including the wiring pattern 11b, with the use of a conductive joining material (not shown) such as solder. Then, as shown in FIG. 4, the component-containing layer 20 is formed on the surface of the base layer 10 with the plurality of electronic components 13 mounted thereon, so as to contain the plurality of electronic components 13 and a portion of the wiring pattern 11b. The component-containing layer 20 is formed such that the surface of the base layer 10 with the plurality of electronic components 13 mounted is covered with an uncured resin sheet, for example, a resin sheet composed of an epoxy resin, and the resin sheet is subjected to pressure bonding, and brought into a cured state. It is to be noted that the component-containing layer 20 is preferably brought into a cured state before stacking the thin resin layer 30.

Next, as shown in FIG. 5, the plurality of bottomed via holes (first via holes) 21 are formed in predetermined positions of the component-containing layer 20. The plurality of via holes 21 can be formed by irradiating predetermined positions of the component-containing layer 20 with laser light from the component-containing layer 20 side to the base layer 10 side. The plurality of via holes 21 each preferably have a tapered shape in cross section, which is reduced in diameter as the cross section is closer to the base layer 10, because of the irradiation with laser light from the component-containing layer 20 side. In addition, the plurality of via holes 21 are formed to reach the wiring pattern 11b. Further, when the plurality of via holes 21 are formed with laser light, a desmear treatment is carried out for dissolving and removing residues in the plurality of via holes 21 with a concentrated sulfuric acid, a chromic acid, a mixed acid thereof, or the like. The resin multilayer substrate 1 subjected to the desmear treatment is dried, because the desmear treatment is a wet treatment.

Next, as shown in FIG. 6, the thin resin layer 30 with the plurality of via holes 31 formed therein is stacked on the component-containing layer 20 so as to provide the plurality of via holes 21 in communication with the plurality of via holes 31. The thin resin layer 30 is composed of a thermosetting resin such as an epoxy resin, and uncured at the time of stacking on the component-containing layer 20. Therefore, a retention film 38 for retaining a shape, such as a PET film, is attached to the thin resin layer 30. With the retention film 38 attached to the thin resin layer 30, laser light irradiation from the retention film 38 side forms the plurality of via holes (second via holes) 31 in the thin resin layer 30. Further, when the plurality of via holes 31 are formed in the thin resin layer 30, a plurality of via holes (third via holes) 39 in communication with the plurality of via holes 31 are formed in the retention film 38. The via holes 31, 39 each have a tapered shape in cross section, which is reduced in diameter from the retention film 38 side toward the thin resin layer 30 side. The thin resin layer 30 with the retention film 38 attached thereto is attached to the component-containing layer 20 so that the thin resin layer 30 side comes into contact with the component-containing layer 20. It is to be noted that the via holes are formed so that the upper and lower diameters of the via hole 31 are smaller than the upper diameter of the via hole 21. In this case, the lower end of the via hole 31 refers to the side in communication with the via hole 21, whereas the upper end of the via hole 31 refers to the side opposite to the side in communication with the via hole 21. In addition, the upper end of the via hole 21 refers to the side in communication with the via hole 31.

Further, after the thin resin layer 30 with the via holes 31 formed therein is stacked on the component-containing layer 20 so that the via holes 21 formed in the component-containing layer 20 are brought into communication with the via holes 31, the via holes 21, 31 are preferably further subjected to processing to provide via holes in communication with each other (hole-forming processing) by an approach such as laser light irradiation from the retention film 38 side or pin insertion. In specific processing to provide via holes in communication with each other (hole-forming processing), the thin resin layer 30 stacked on the component-containing layer 20 is irradiated from the retention film 38 side with laser light which has a diameter at least larger than the diameter of the via hole 31. In addition, in the processing to provide via holes in communication with each other (hole-forming processing), as shown in FIGS. 7A-7C, with the thin resin layer 30 stacked on the component-containing layer 20 (FIG. 7A), a pin 300 which has a diameter at least larger than the diameter of the via hole 31 is inserted from the retention film 38 side (FIG. 7B). The processing to provide via holes in communication with each other (hole-forming processing) applies a force in a direction toward the via hole 21 to a portion of the uncured thin resin layer 30 in contact with the via hole 31 to cause a deformation in the portion of the thin resin layer 30 in contact with the via holes 31, which projects toward the via hole 21 (FIG. 7C).

Moreover, when the thin resin layer 30 is stacked on the component-containing layer 20, the via hole 31 may be crushed because the thin resin layer 30 is uncured. However, the via holes 21 in communication with the via holes 31 can be secured by carrying out the processing to provide via holes in communication with each other (hole-forming processing) after stacking the thin resin layer 30 on the component-containing layer 20. The resin multilayer substrate 1 as shown in FIG. 1 can be formed by carrying out the processing to provide via holes in communication with each other as shown in FIGS. 7A-7C, and filling the via holes 21, 31 with the conductive paste.

As shown in FIG. 8, with the retention film 38 attached to the thin resin layer 30, the plurality of via holes 21, 31, 39 are filled with the conductive paste 22. It is to be noted that the conductive paste 22 preferably is a paste obtained by mixing a metal powder such as silver, copper, or tin in a solvent or the other suitable material, for example. Then, as shown in FIG. 9, the conductive paste 22 filling the via holes 39 formed in the retention film 38 is adapted to serve as the conductive paste 22 protruded in a convex shape upwardly from the plurality of via holes 31 by peeling off the retention film 38 from the thin resin layer 30. It is to be noted that the amount of the conductive paste 22 protruded from the plurality of via holes 31 can be controlled by changing the thickness of the retention film 38.

Next, as shown in FIG. 10, metal foil 40 (for example, copper foil) is attached to the thin resin layer 30. The metal foil 40 is attached to the uncured thin resin layer 30, and then, the thin resin layer 30 is brought into a cured state to tightly join the metal foil 40 and the component-containing layer 20. More specifically, the thin resin layer 30 functions as a joining layer to join the metal foil 40 and the component-containing layer 20. Furthermore, when the metal foil 40 is attached to the thin resin layer 30, the conductive paste 22 protruded from the plurality of via holes 31 as shown in FIG. 9 is pushed into the plurality of via holes 31. The conductive paste 22 protruded from the plurality of via holes 31 can be pushed into the plurality of via holes 31 without leaving any of the paste, because the metal foil 40 has a cross section larger than the cross section of the plurality of via holes 31 on the protruded side of the conductive paste 22 (the cross section in the plane of the via holes 31 in contact with the metal foil 40).

Pushing the conductive paste 22 protruded from the plurality of via holes 31 into the plurality of via holes 31 applies a force in a direction toward the plurality of via holes 21 to a portion of the uncured thin resin layer 30 in contact with the plurality of via conductors 33 to cause a deformation in the portion of the thin resin layer 30 in contact with the plurality of via conductors 33, which projects toward the plurality of via holes 21. Then, the conductive paste 22 and the thin resin layer 30 are brought into a cured state to cause the portion of the thin resin layer 30 in contact with the plurality of via conductors 33 to form projections 35 projecting into the plurality of via conductors 23. In addition, pushing the conductive paste 22 protruded from the plurality of via holes 31 into the plurality of via holes 21, 31 increases the density of the conductive paste 22 in the via holes 21, 31, and reduces the resistance value of the via conductors 23, 33 obtained from the conductive paste 22 cured.

Next, as shown in FIG. 11, the metal foil 40 is subjected to patterning into a predetermined pattern with the use of photolithography to form the surface electrodes 34. Then, as shown in FIG. 1, the resist layers 36 are formed in predetermined positions of the surface electrodes 34 with the use of photolithography, and the IC element 12 is mounted on the wiring pattern 11a side of the base layer 10 with the use of a conductive joining material such as solder.

As described above, the resin multilayer substrate 1 according to preferred embodiment 1 includes at least the component-containing layer 20 and the thin resin layer 30 stacked on the surface of the component-containing layer 20, and the portions of the thin resin layer 30 in contact with the plurality of via conductors 33 define the projections 35 projecting into the plurality of via conductors 23, that is, in the planar direction and thickness direction of the component-containing layer 20. Therefore, the increased area of contact between the thin resin layer 30 and the conductive paste 22, and thus, the increased joining force between the thin resin layer 30 and the plurality of via conductors 33 can decrease the possibility of peeling off of the surface electrodes 34 along with the conductive paste 22 from the thin resin layer 30.

In addition, in the method for manufacturing the resin multilayer substrate 1 according to preferred embodiment 1, after the thin resin layer 30 with the plurality of via holes 31 formed therein is stacked on the component-containing layer 20 with the plurality of via holes 21 formed therein, the plurality of via holes 21 and the plurality of via holes 31 are filled with the conductive paste 22. Thus, the ingress of the conductive paste into the interface between the stacked component-containing layer 20 and thin resin layer 30 is prevented from occurring, and the insulation performance is not decreased between the component-containing layer 20 and the thin resin layer 30. Furthermore, in the method for manufacturing the resin multilayer substrate 1 according to preferred embodiment 1, the portion of the thin resin layer 30 in contact with the plurality of via conductors 33 is projected inwardly into the plurality of via conductors 23 obtained by filling with the conductive paste 22 before bringing the conductive paste 22 and the thin resin layer 30 into a cured state. Thus, the portion of the thin resin layer in contact with the via conductors 33 can define the projections projecting into the via conductors 23. Therefore, the portion of the thin resin layer 30 in contact with the via conductors 33 can push the conductive paste 22 into the plurality of via holes 21, 31 to increase the density of the conductive paste 22 in the via holes 21, 31, and reduce the resistance value of the via conductors 23, 33.

Figure 12:
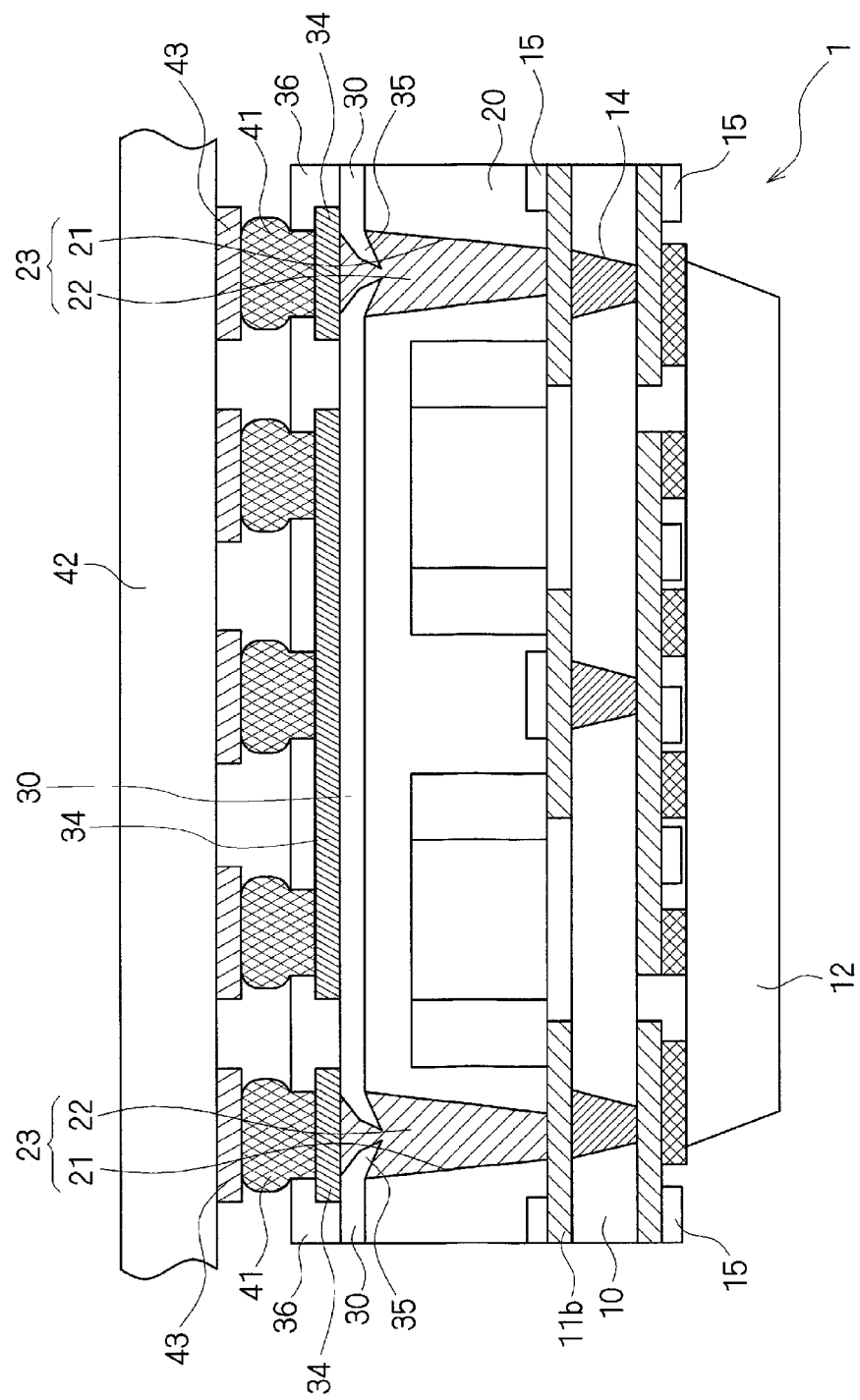
FIG. 12 is a schematic diagram illustrating the structure of the resin multilayer substrate according to preferred embodiment 1 of the present invention, which is mounted on a mother board.

Further, it is also possible to mount the resin multilayer substrate 1 according to preferred embodiment 1 on a substrate. FIG. 12 is a schematic diagram illustrating the structure of the resin multilayer substrate 1 according to preferred embodiment 1 of the present invention, which is mounted on a mother board. As shown in FIG. 12, the resin multilayer substrate 1 is mounted on a mother board 42 by forming solder bumps 41 on the surface electrodes 34 and connecting the solder bumps 41 to electrodes 43 formed on the mother board 42. In this case, the mother board 42 serves as an electronic circuit substrate to electrically connect a plurality of mounted resin multilayer substrates 1 and electronic components 13 to each other.

Figure 13:
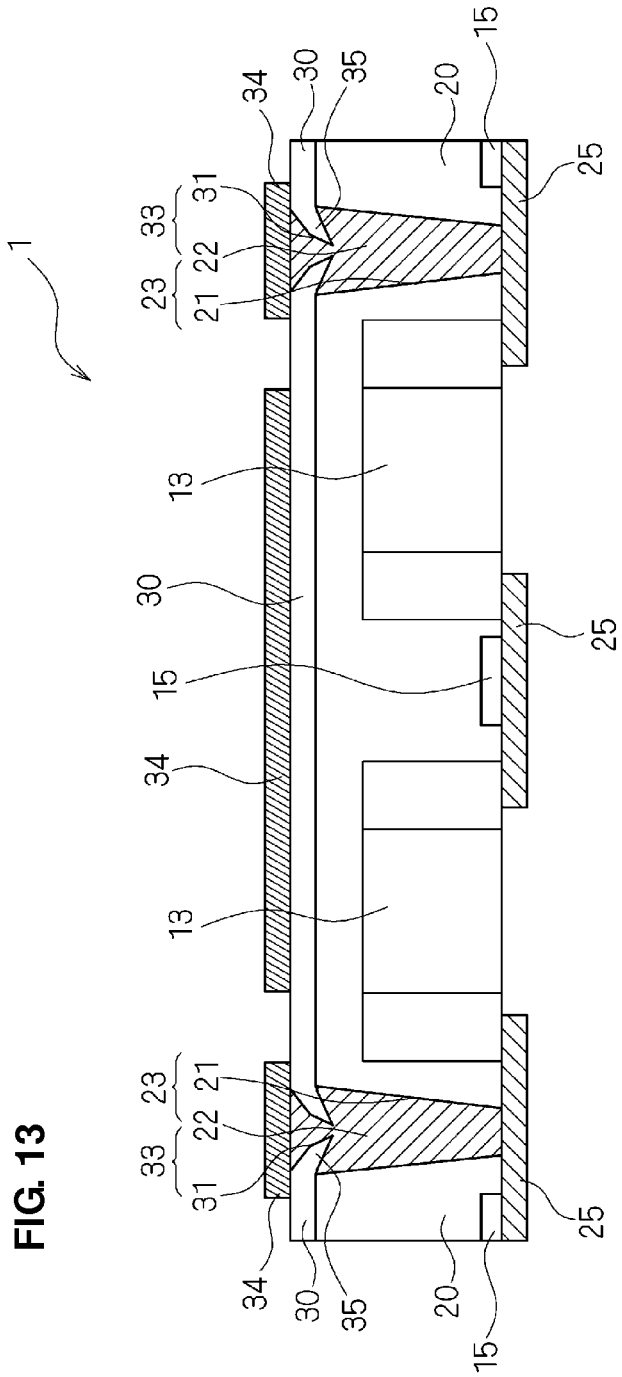
FIG. 13 is a schematic diagram illustrating the structure of the resin multilayer substrate including no base layer, according to preferred embodiment 1 of the present invention.

In addition, the resin multilayer substrate 1 according to preferred embodiment 1 is not to be considered limited to a substrate including the base layer 10 as shown in FIG. 1, and the resin multilayer substrate 1 may include no base layer 10. FIG. 13 is a schematic diagram illustrating the structure of the resin multilayer substrate 1 including no base layer 10, according to preferred embodiment 1 of the present invention. As shown in FIG. 13, the resin multilayer substrate 1 includes the component-containing layer 20 and thin resin layer 30 stacked sequentially, and includes no base layer 10. The component-containing layer 20 includes therein a plurality of electronic components 13 mounted on a wiring pattern 25, which is provided on the surface opposite to the surface with the thin resin layer 30 stacked thereon. The other structure is preferably the same or substantially the same as the structure of the resin multilayer substrate 1 shown in FIG. 1, and the same components are thus denoted by the same symbols to omit detailed descriptions thereof.

Preferred Embodiment 2

Figure 14:
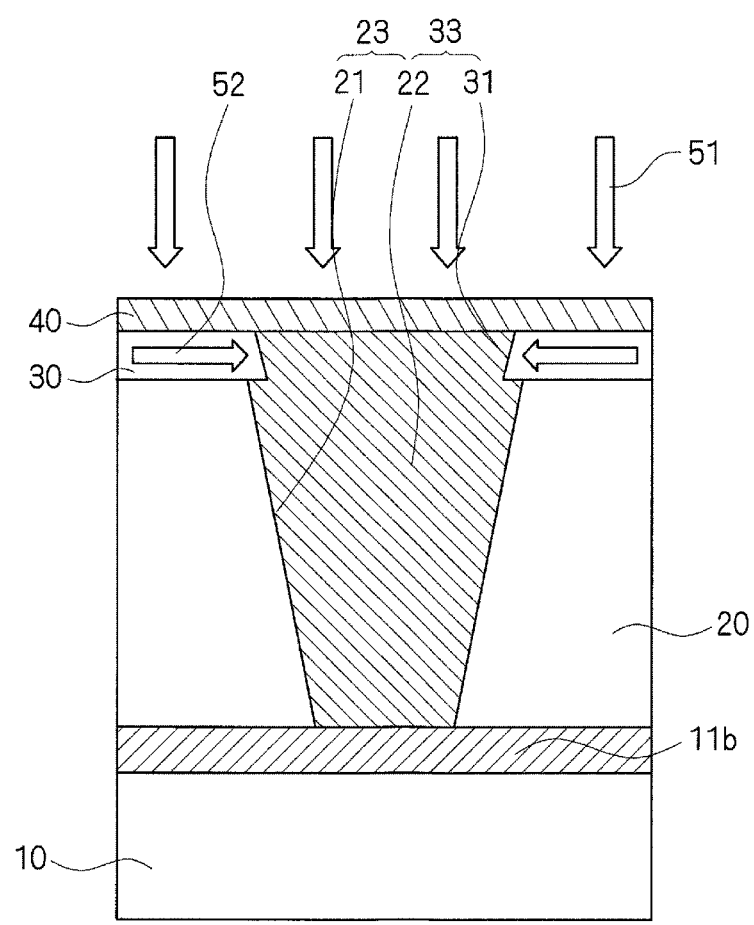
FIG. 14 is a schematic diagram for explaining a method for manufacturing a resin multilayer substrate according to preferred embodiment 2 of the present invention.
Figure 15:
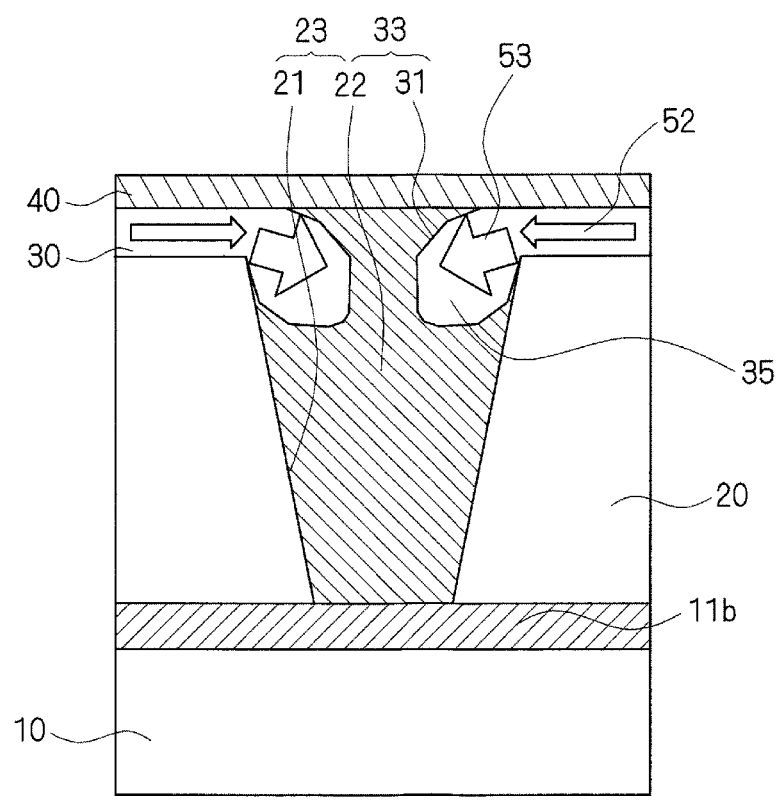
FIG. 15 is a schematic diagram for explaining the method for manufacturing the resin multilayer substrate according to preferred embodiment 2 of the present invention.

FIGS. 14 and 15 are schematic diagrams for explaining a method for manufacturing a resin multilayer substrate 1 according to preferred embodiment 2 of the present invention. FIG. 14 shows pressurizing, in a direction toward a thin resin layer 30, metal foil 40 attached to the thin resin layer 30 after via holes 21, 31 in communication with each other are filled with a conductive paste 22, and FIG. 15 shows the metal foil 40 subjected to pressurization in the direction toward the thin resin layer 30. The method for manufacturing the resin multilayer substrate 1 according to preferred embodiment 2 preferably is the same or substantially the same as the manufacturing method according to Preferred embodiment 1 as shown in FIGS. 2 through 8, except that the thin resin layer 30 itself is stacked on a component-containing layer 20 without attaching a retention film 38 to the thin resin layer 30, and detailed descriptions will be thus omitted. It is to be noted that while FIGS. 14 and 15 illustrate via conductors 23, 33 in communication with each other formed in the resin multilayer substrate 1 and the vicinity of the via conductors, the other structure preferably is the same or substantially the same as the structure of the resin multilayer substrate 1 shown in FIG. 1, and the illustration of the structure is thus omitted.

As shown in FIG. 14, the metal foil 40 is attached to the thin resin layer 30 after the via holes 21, 31 in communication with each other are filled with the conductive paste 22, and the metal foil 40 is pressurized in the direction of an arrow 51 (in the direction toward the thin resin layer 30). When the metal foil 40 is pressurized in the direction of the arrow 51, the uncured thin resin layer 30 is reduced in thickness, and intended to spread in the direction of an arrow 52. The thin resin layer 30 spread in the direction of the arrow 52 is, as shown in FIG. 15, pushed into the via conductors 23, 33. The thin resin layer 30 pushed into the via conductors 23, 33 is pressurized in the direction of the arrow 51 to project in the direction of an arrow 53 from the via conductor 33 toward the via conductor 23. More specifically, through the pressurization of the metal foil 40 in the direction of the arrow 51, the thin resin layer 30 is pressurized in the direction toward the component-containing layer 20 to cause a portion of the thin resin layer 30 in contact with the via conductor 33 to form projections 35 projecting into the via conductor 23. The subsequent manufacturing method preferably is the same or substantially the same as the manufacturing method shown in FIG. 11, and detailed descriptions thereof will be thus omitted.

As described above, for the resin multilayer substrate 1 according to preferred embodiment 2 of the present invention, the portion of the thin resin layer 30 in contact with the via conductor 33 defines the projections 35 projecting into the via conductor 23, through the pressurization on, in the direction toward the component-containing layer 20, the thin resin layer 30 after the via holes 21, 31 in communication with each other are filled with the conductive paste 22. Accordingly, in response to the pressurization, the conductive paste 22 can be pushed into the via holes 21, 31 by the reduction of the thin resin layer 30 in thickness to increase the density of the conductive paste 22 in the via holes 21, 31, and reduce the resistance value of the via conductors 23, 33.

Preferred Embodiment 3

Figure 16:
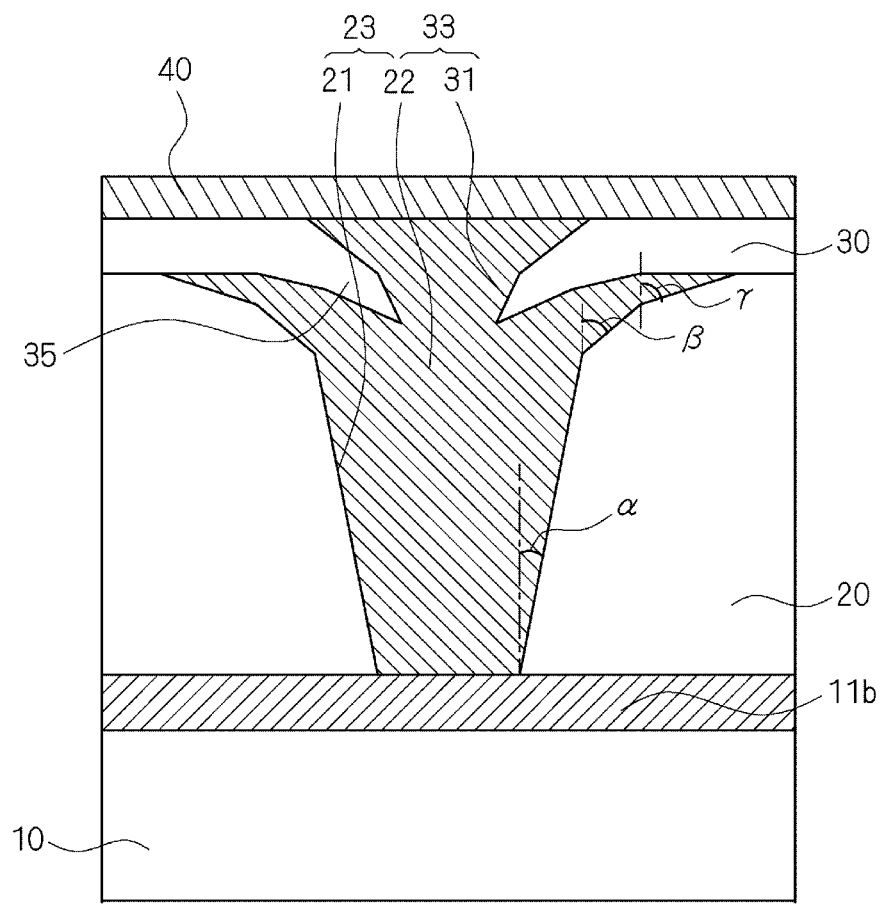
FIG. 16 is a schematic diagram illustrating the structure of a via hole in a resin multilayer substrate according to preferred embodiment 3 of the present invention.

FIG. 16 is a schematic diagram illustrating the structure of via holes 21, 31 in a resin multilayer substrate 1 according to preferred embodiment 3 of the present invention. It is to be noted that while FIG. 16 illustrates via conductors 23, in communication with each other included in a resin multilayer substrate 1 and the vicinity of the via conductors, the other structure preferably is the same or substantially the same as the structure of the resin multilayer substrate 1 shown in FIG. 1, and the illustration of the structure is thus omitted. It is to be noted that while FIG. 16 shows an example of changing the taper angle of a via hole 21 in stages for the purpose of illustration, the taper angle of a via hole 21 is continuously changed in the case of an actual resin-layered substrate 1. It is to be noted that the taper angle refers to an angle formed by a perpendicular line relative to the surface of a base layer 10 with a wiring pattern 11b located thereon and the surface of a component-containing layer 20 including the via hole 21.

As shown in FIG. 16, the via hole 21 formed in the component-containing layer 20 has a taper angle increased in the order of an angle $\alpha$, an angle $\beta$, and an angle $\gamma$ ($\alpha<\beta<\gamma$) from the vicinity of the wiring pattern 11b to the vicinity of the thin resin layer 30. It is to be noted that the taper angle of the via hole 21 is not to be considered limited to the case of the three-stage increase, the taper angle may be increased in two stages, or increased continuously, as long as at least the taper angle in the vicinity of the thin resin layer 30 is larger than the taper angles in any other sections.

In order for the via hole 21 to have the larger taper angle in the vicinity of the thin resin layer 30 than the taper angle in the other section, the component-containing layer 20 will be removed which supports a portion of the thin resin layer 30 in contact with the via conductor 33. The uncured portion of the thin resin layer 30 in contact with the via conductor 33 without the component-containing layer 20 for support thus bends into the via conductor 23 under its own weight to form projections projecting in a direction from the via conductor 33 toward the via conductor 23. More specifically, in the resin multilayer substrate 1 according to preferred embodiment 3, without the need for a step such as pressurizing the thin resin layer 30 in a direction toward the component-containing layer 20, the portion of the thin resin layer 30 in contact with the via conductor 33 can define the projections 35 projecting into the via conductor 23, by only forming the via hole 21 in which the taper angle in the vicinity of the thin resin layer 30 is larger than the taper angle in the other section.

As described above, for the resin multilayer substrate 1 according to preferred embodiment 3, a plurality of via holes 21 are arranged so that the taper angle in the vicinity of the thin resin layer 30 is larger than the taper angle in the other section. Therefore, a portion of the thin resin layer 30 in contact with via conductors 33 defines projections 35 projecting into via conductors 23, and the area of contact is thus increased between the thin resin layer 30 and a conductive paste 22. Therefore, the joining force between the thin resin layer 30 and the via conductors 33 can be increased to decrease the possibility of peeling off of surface electrodes 34 along with the conductive paste 22 from the thin resin layer 30.

It is to be noted that the resin multilayer substrates according to Preferred Embodiments 1 to 3 are not to be considered limited to cases where all of the portions of the thin resin layer 30 in contact with the plurality of via conductors 33 define the projections 35 projecting into the plurality of via conductors 23 in a substantially uniform manner, and at least some of the portions of the thin resin layer 30 in contact with the plurality of via conductors 33 may define the projections 35 projecting into the plurality of via conductors 23.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin multilayer substrate comprising:
a first resin layer which contains an electronic component;
a second resin layer which is stacked on a first surface of the first resin layer and is thinner than the first resin layer;
a surface electrode located on a first surface of the second resin layer which is opposite to a second surface of the second resin layer stacked on the first surface of the first resin layer;
a first via conductor provided in the first resin layer; and
a second via conductor provided in the second resin layer; wherein
the first via conductor includes an end reaching the first surface of the first resin layer;
the second via conductor provided in the second resin layer includes a first end electrically connected to the surface electrode and a second end electrically and physically connected to the first via conductor provided in the first resin layer containing the electronic component;
at least a portion of the second resin layer in contact with the second via conductor defines a projection that projects into the first via conductor in a direction in which the second surface of the second resin layer extends and in a direction in which the first and second resin layers are stacked; and the projection of the second resin layer extends through a plane defined by the first surface of the first resin layer on which the second resin layer is stacked.

2. The resin multilayer substrate according to claim 1, further comprising a base layer including a wiring pattern located on at least one surface of the base layer, wherein the first resin layer and the second resin layer are sequentially stacked on a surface of the base layer with the wiring pattern located thereon, and the wiring pattern is electrically connected to the first via conductor.

3. The resin multilayer substrate according to claim 1, further comprising a wiring pattern located on a second surface of the first resin layer opposite to the first surface of the first resin layer including the second resin layer thereon, wherein
the electronic component contained in the first resin layer is mounted on the wiring pattern.

4. The resin multilayer substrate according to claim 2, wherein the electronic component is mounted on at least one surface of the base layer.

5. The resin multilayer substrate according to claim 1, wherein the surface electrode is electrically connected to an electrode located on a mother board.

6. The resin multilayer substrate according to claim 1, wherein the first via conductor is arranged such that a taper angle adjacent to an area of the second resin layer is larger than a taper angle in another section.

* * * * *